US006924497B2

(12) United States Patent
Suresh et al.

(10) Patent No.: US 6,924,497 B2
(45) Date of Patent: *Aug. 2, 2005

(54) SYSTEMS FOR MEASURING STRESSES IN LINE FEATURES FORMED ON SUBSTRATES

(75) Inventors: Subra Suresh, Wellesley, MA (US); Ares J. Rosakis, Altadena, CA (US)

(73) Assignee: California Institute of Technology, Pasadena, CA (US)

( * ) Notice: Subject to any disclaimer, the term of this patent is extended or adjusted under 35 U.S.C. 154(b) by 45 days.

This patent is subject to a terminal disclaimer.

(21) Appl. No.: 10/630,512

(22) Filed: Jul. 29, 2003

(65) Prior Publication Data

US 2004/0075825 A1 Apr. 22, 2004

Related U.S. Application Data

(63) Continuation of application No. 09/560,719, filed on Apr. 27, 2000, now Pat. No. 6,600,565.
(60) Provisional application No. 60/200,499, filed on Apr. 25, 2000.

(51) Int. Cl.[7] ............................................... G01N 21/86
(52) U.S. Cl. ................... 250/559.4; 250/559.22
(58) Field of Search ......................... 250/559.4, 559.22, 250/559.45, 559.27; 356/511, 239.3, 239.7, 237.4, 237.5, 32, 35.5, 630

(56) References Cited

U.S. PATENT DOCUMENTS

| 5,227,641 | A |   | 7/1993  | Cheng |
| 5,966,019 | A |   | 10/1999 | Borden |
| 6,031,611 | A |   | 2/2000  | Rosakis et al. |
| 6,469,788 | B2 | * | 10/2002 | Boyd et al. ................. 356/369 |
| 6,513,389 | B2 |   | 2/2003  | Suresh et al. |
| 6,600,565 | B1 | * | 7/2003  | Suresh et al. ............... 356/521 |

FOREIGN PATENT DOCUMENTS

JP          05-335217          12/1993

OTHER PUBLICATIONS

L.B. Freuend, "Substrate Curvature Due to Thin Film Mismatch Strain In the Nonlinear Deformation Range", Division of Engineering, Brown University, Providence, RI 02912, Jan. 1999.

* cited by examiner

*Primary Examiner*—Que T. Le
(74) *Attorney, Agent, or Firm*—Fish & Richardson P.C.

(57) ABSTRACT

Methods and systems for evaluating stresses in line features formed on substrates. Stresses may be computed from measured curvature information based on simple analytical functions. The curvature information can be obtained optically by, e.g., a coherent gradient sensing method, to obtain a full-field measurement of an illuminated area.

9 Claims, 7 Drawing Sheets

FIG. 5

Illuminate an optical probe beam onto a substrate-based device with line features formed over the substrate to produce a reflected probe beam which acquires surface spatial gradient information of the illuminated area

Process the surface gradient information in the reflected probe beam to simultaneously measure first and second curvatures at a location of a line feature along the longitudinal and transverse directions of the line feature

Compute stresses on the line feature by using an analytical function shown in Equation (1) based on measured first and second curvatures

SYSTEMS FOR MEASURING STRESSES IN LINE FEATURES FORMED ON SUBSTRATES

This application claims the benefit and is a continuation of U.S. patent application Ser. No. 09/560,719 filed Apr. 27, 2000, now U.S. Pat. No. 6,600,565 which claims from Provisional Application No. 60/200,499, filed on Apr. 25, 2000.

BACKGROUND

This application relates to evaluation of stress fields and properties in line features formed on substrates.

Measurements of various properties of a substrate and features fabricated on the substrate may have important applications. For example, manufacturing of certain devices requires fabrication of various features and components on a substrate (e.g., a semiconductor or a glass substrate). Such substrate-based integrated devices include, among others, integrated electronic circuits where micro circuit components are formed on a semiconductor substrate, integrated optical devices where micro optical components are fabricated on a substrate, micro-electro-mechanical systems where micro actuators and other mechanical components are fabricated on a semiconductor substrate, flat panel display systems where light-emitting elements, thin-film transistors and other elements are fabricated on a transparent substrate (e.g., a glass), or a combination of two or more of the above devices.

Different materials and different structures are usually formed on the substrate and are in contact with one another. Some devices may also use complex multilayer geometry. Hence, the interfacing of different materials and different structures may cause a complex stress state in each feature due to differences in the material properties and the structure properties at interconnections under different fabrication processes and environmental factors (e.g., variations or fluctuations in temperature). In fabrication of an integrated circuit, for example, the stress state of the interconnect conducting lines may be affected by film deposition, rapid thermal etching, chemical-mechanical polishing, and passivation during the fabrication process.

It is desirable to measure stresses on various features formed on the substrate to improve the design of the device structure, selection of materials, fabrication process, and other aspects of the devices so that the performance and reliability of the device can be enhanced. The stress measurements may be used to assess or evaluate the reliability of materials against failure from such phenomena as electromigration, stress-voiding and hillock formation. The stress measurements may also be used to facilitate quality control of the mechanical integrity and electromechanical functioning of circuit chip dies during large scale production in wafer fabrication facilities. In addition, the stress measurements may be used to improve the design of various thermal treatments (such as temperature excursions during passivation) and chemical and mechanical treatments (such as polishing) to reduce their contribution to the residual stresses in the final device.

SUMMARY

A system according to one embodiment of the invention includes an optical detection module to obtain surface curvature information of a substrate-based device which has line features formed on a substrate, and a processing module to produce stress information of the line features based on the curvature information. The optical detection module may include a coherent gradient sensing system to measure the surface gradient of a surface based on phase information in the wavefront of a reflected optical probe beam.

One method according to one embodiment includes first measuring a first curvature of a substrate at a location and along a longitudinal direction of a line feature formed at the location on the substrate and then measuring a second curvature of the substrate at the same location along a transverse direction perpendicular to the longitudinal direction. Next, an analytical function is used to compute stresses on the line feature based on measured first and second curvatures.

Alternatively, stresses of a line feature may be determined before the line feature is formed. In this method, curvatures of a substrate are measured before a film is deposited. Then the film is deposited on the substrate and its curvature is measured. Next, the stress information of the deposited film is obtained and is used to determine stresses on a line feature to be patterned from the film based on an analytical function. This method can be extended to structures where line features are formed over two or more underlying films on the substrate.

Another method determines stress information of line features embedded in trenches of a layer formed on a substrate. The curvatures of the embedded line features are measured by using an optical probe beam to obtain curvature map of the illuminated area based on spatial gradient information in the reflected optical beam. Then measured curvatures are compared to curvatures of the line features computed from an analytical function. The deviation is then used to determine presence of residual stresses.

Yet another method measures curvatures of a line feature and a film from which the line feature is formed as a function of temperature to determine yield temperatures at which the line and the film change their curvature dependence of the temperature from a linear manner to a nonlinear manner. The ratio between a yield stress of the line feature and a yield stress of the film at their respective yield temperatures can then be determined from an analytical function.

These and other features, and associated advantages of will be apparent from the description and drawings, and from the claims.

DESCRIPTION OF DRAWINGS

FIGS. 5 and 6 are flowcharts showing two methods of determining stresses of line features based on optical full-field surface curvature measurements.

DETAILED DESCRIPTION

The methods and systems of this application include at least an optical detection mechanism to measure curvature parameters of line features formed on a substrate and a processing mechanism to extract stress information of the line features from the measured curvature parameters. The optical detection mechanism may provide a full-field measuring capability to simultaneously measure curvatures of one or more areas where line features are located, without the conventional point-to-point scanning measurement. The processing mechanism may use only the curvature information to directly compute the stresses based on an analytical formulation to eliminate complex numerical computation. Hence, the stress information can be obtained within a short processing time. This combination of the full-field optical detection and the processing can produce a spatial map of the stress distribution in the area under measurement in virtually real time so long as the change in the stress is slower than the processing time.

Figure 1:
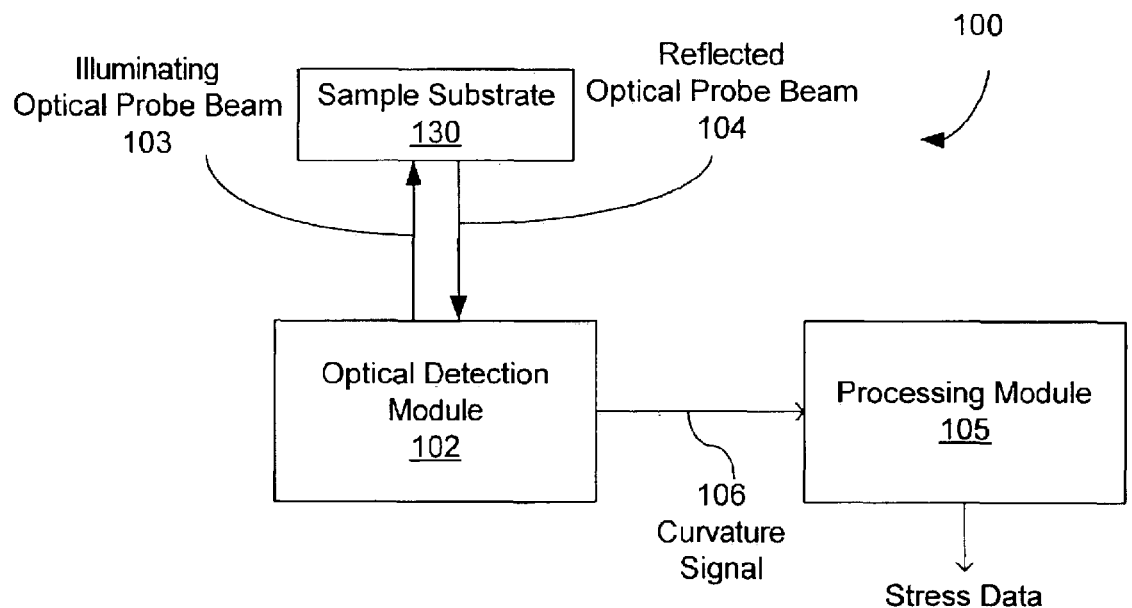
FIG. 1 is a block diagram of a stress measurement system according to one embodiment of the invention.

FIG. 1 shows a stress measurement system 100 according to one embodiment which includes an optical detection module 102 to implement the optical detection mechanism and a data processing module 105 to implement the processing mechanism. The optical detection module 102 produces an illumination optical beam 103 to a surface of the sample substrate 130 and then detects the reflected beam 104. The illumination beam 103 is directed so as to illuminate an area which includes one or more areas having line features under measurement. The reflected beam 104 from the sample substrate 130 is then optically processed to produce an optical pattern that has the curvature information of the entire illuminated area. This optical pattern is converted into a curvature signal 106. The signal is sent to the processing module 105 which may include an electronic processor or other type of processor. The curvature signal 106 may be an electronic signal representing the optical pattern. The signal is then processed to produce curvature data for the entire illuminated area on the substrate 130. The processing module 105 produces desired stress data on line features formed on any one or more desired locations in the illuminated area on the substrate 130 based on respective curvature data.

Figure 2:
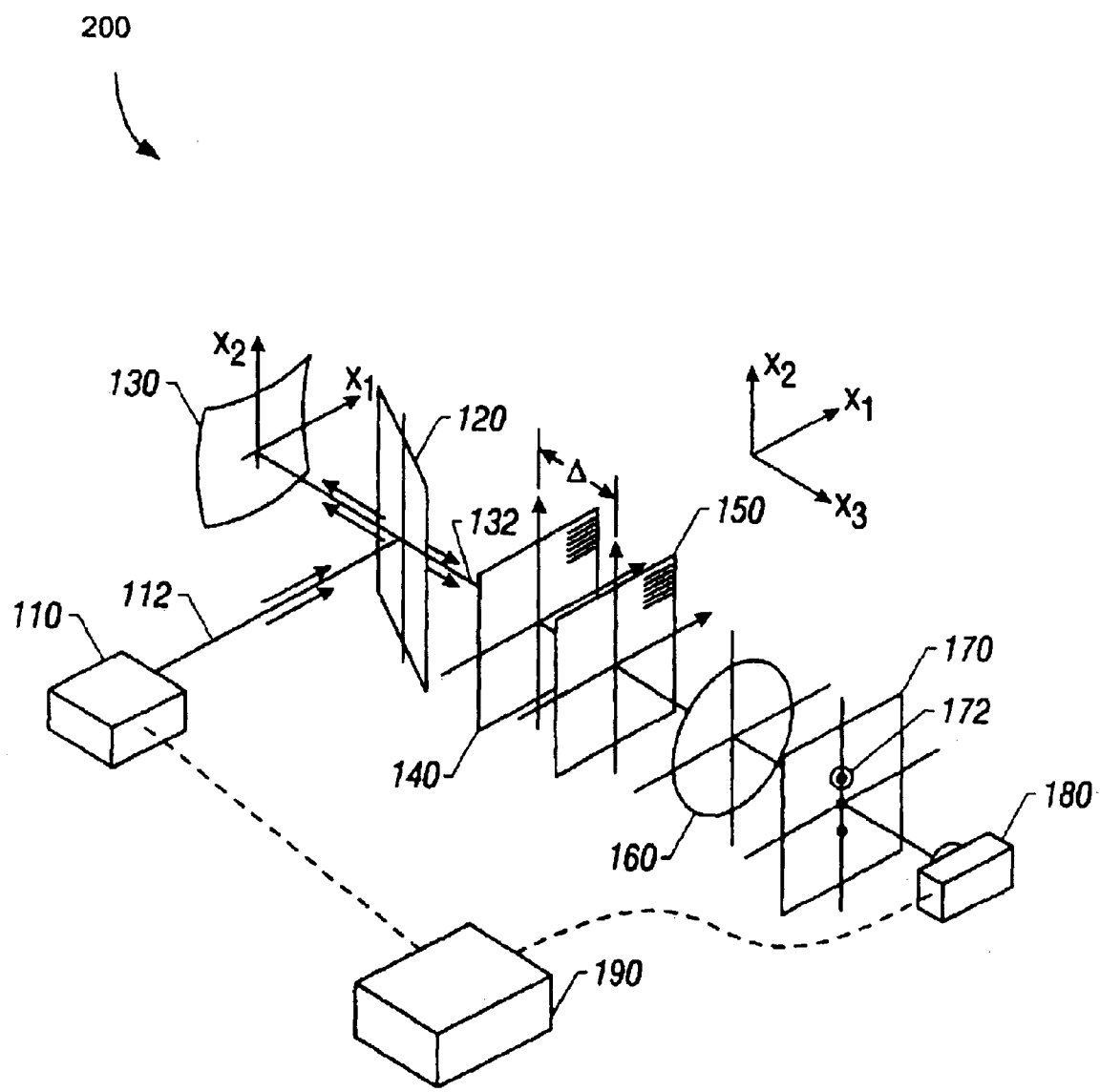
FIG. 2 illustrates one embodiment of a coherent gradient sensing system.

FIG. 2 shows one embodiment of a coherent gradient sensing ("CGS") system 200 as an implementation of the optical detection module 102. See, U.S. Pat. No. 6,031,611 to Rosakis et al. The CGS system 200 uses a collimated coherent optical beam 112 from a light source 110 as an optical probe to obtain curvature information indicative of a specularly reflective surface 130 formed of essentially any material. An optical element 120 such as a beam splitter can be used to direct the beam 112 to the surface 130. When the reflective surface 130 is curved, the wavefront of the reflected probe beam 132 is distorted and thereby the reflected probe beam 132 acquires an optical path difference or phase change associated with the curvature of the surface 130 under measurement. This system produces a "snapshot" of each point within the illuminated area on the surface 130 and hence the curvature information at any point along any direction within the illuminated area can be obtained. This can eliminate the need for measuring one point at a time in a sequential manner by using a scanning system.

Two gratings 140 and 150 spaced from each other are placed in the path of the reflected probe beam 132 to manipulate the distorted wavefront for curvature measurement. Two diffraction components produced by the second grating 150 diffracting two different diffraction components produced by the first grating 140 are combined, by using an optical element 160 such as a lens, to interfere with each other. The diffraction by the two gratings 140 and 150 effectuates a relative spatial displacement, i.e., a phase shift, between the two selected diffraction components. This phase shift is a function of the spacing between the two gratings 140 and 150 when other grating parameters are fixed. A spatial filter 170 is placed relative to the optical element 160 to transmit the interference pattern of the selected diffraction components and to block other diffraction orders from the second grating 150.

The transmitted interference pattern is then captured by an imaging sensor 180 which may include an array of sensing pixels, such as a CCD array, to produce an electrical signal representing the interference pattern. A signal processor 190, which may be part of the processing module 105 in FIG. 1, processes the electrical signal to extract a spatial gradient of the phase distortion caused by the curvature of the reflective surface 130. This spatial gradient, in turn, can be further processed to obtain the curvature information and hence a curvature map of the illuminated area on the surface 130 can be obtained. A single spatial differentiation is performed on the interference pattern to measure the surface gradient. This technique can provide accurate measurements of surface curvatures when the curvature variation of the surface is gradual, i.e., when the out-of-plane displacement is less than the thickness of the film, the line or the substrate. This technique is insensitive to rigid body motion in comparison with some other interferometric techniques. Details of this data processing operation are described in the above-referenced U.S. Pat. No. 6,031,611 to Rosakis et al.

The two gratings 140 and 150 in general may be any gratings, with different grating periods and oriented with respect to each other at any angle. Preferably, the two gratings may be oriented with respect to each other in the same direction and may have the same grating periods to simplify the data processing. In this case, the grating direction is essentially set by the direction of the relative spatial displacement ("shearing") between the two selected diffraction components due to the double diffractions by the gratings 140 and 150.

Figure 3:
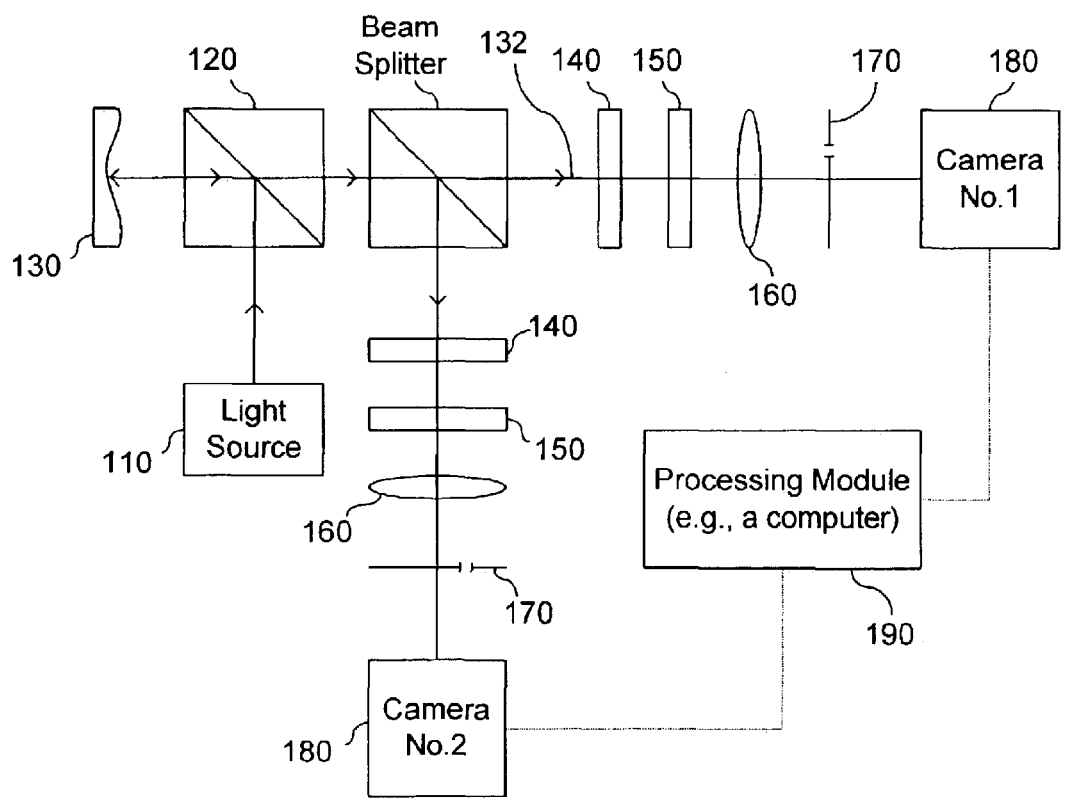
FIG. 3 shows a coherent gradient sensing system having two independent optical arms to obtain simultaneously spatial shearing in two different directions.

Certain applications may require spatial shearing in two different directions to obtain a full-field two-dimensional curvature measurement. This may be done by using the CGS system 200 to perform a first measurement when the sample surface 130 is at a first orientation and subsequently to perform a second measurement when the sample surface 130 is rotated to a second orientation (e.g., perpendicular to the first orientation). Alternatively, a two-arm CGS system, shown in FIG. 3 may be implemented to have two separate sets of double gratings in two different directions to simultaneously produce the interference pattern in two different spatial shearing directions. Hence, time-varying effects in the curvature distribution in both spatial shearing directions can be obtained.

The above CGS systems may be used to measure curvatures of various features and components formed on a substrate either directly or indirectly. In the direct measurement, the probe beam in the CGS can be directly sent to the top surface of these devices to obtain the curvature information. This usually requires that the surface features and components and their surrounding areas are preferably smooth and optically reflective. In addition, it is desirable that properties of the features and components and their surrounding areas other than their curvatures do not significantly contribute to the wavefront distortion. Hence, the wavefront distortion can be used as an indicator of the curvatures of the area illuminated by optical probe beam. For example, some completed integrated circuits have a top passivation layer, usually made of a non-conductive dielectric material, over the circuit elements, on the substrate to protect the underlying circuits. The surface of the passivation layer is in general smooth and is sufficiently reflective for CGS measurements.

However, the above conditions may not be met in some other substrate-based devices. For example, features and components formed on the front side of a substrate or their surrounding areas may not be optically reflective. The features and components on the front side may distort the reflected wavefront due to factors other than the curvatures, such as the height of a feature or component being different from its surrounding areas. In these cases, the curvatures of the features or components may be indirectly measured by inference from the curvature measurements of the corresponding locations on the opposite surface on the back side of the substrate. This is possible because the stresses in the non-continuous features and components formed on the substrate can cause the substrate to deform and the thin films formed over the substrate generally conform to the substrate surface.

When the heights of certain features are different from their surroundings, the phase distortion on the wavefront of the reflected probe beam for each feature includes at least the portion contributed from the height difference and the portion contributed from the curvatures. In addition to using the back side of the substrate for the CGS measurement, the CGS measurement may also be performed by illuminating the front side. The curvature information can thus be extracted by removing the effects of the height difference in computation of the curvatures if the height information is known.

In addition to curvature measurements of a completed substrate-based device, the CGS technique can also be used to perform in-situ curvature measurements of a substrate and each layer or feature during each fabrication step of a substrate-based device. The CGS technique can achieve this due to its full-field capability of simultaneously measuring the curvatures of all locations within an illuminated area. Therefore, each measurement can be performed and completed in a short time without interrupting the fabrication sequence. Because the CGS technique uses an optical probe beam as the probe to obtain the curvature information, the measurement is non-invasive and hence does not interfere with the fabrication process when the intensity of the optical probe beam is properly kept below an acceptable level. In addition, the optical probe beam and its reflected beam from the substrate can be conveniently guided to and from the substrate in a processing chamber through one or more optical windows in the processing chamber.

Therefore, during the fabrication of the thin-film layers and various features in each layer, the curvatures and associated stresses of each layer and each feature formed in each layer may be monitored with the CGS technique. This in-situ stress monitoring mechanism may be applied to various aspects of the substrate fabrication.

For example, this in-situ stress monitoring mechanism may be used to screen out a defective batch of processed substrates at any intermediate stage during the fabrication prior to completion of the entire fabrication processes. It is known that fabrication process and associated thermal cycling can introduce stresses in fabricated features. For example, the various metallization processes are carried out at elevated temperatures. Also, the layers may exhibit different mechanical, physical and thermal properties which can lead to high stresses in interconnection structures due to, e.g., mismatch in the amounts of thermal expansion and contraction between dissimilar materials. These stresses can cause, among others, undesired stress-induced voiding and interfacial cracking, and can contribute to electromigration. In addition, the stresses may cause cracking of the substrate. Voiding, electromigration, and substrate cracking are among the leading failure factors in integrated circuits.

Some of the defects are caused by stresses after an intermediate step during the fabrication. A device is defective when the stresses at various parts exceed predetermined acceptable values. The above in-situ stress monitoring can be used to measure the stresses at selected stages or continuously during the fabrication. The measured stresses are compared to the acceptable values. If a measured stress is greater than its acceptable value, a defect is discovered. The fabrication process may be terminated since the final device would be defective. Thus, the remaining fabrication steps need not be carried out. This avoids the wasteful and inefficient practice in some conventional fabrication methods where the defects of the fabricated devices are tested only after the entire fabrication processes are completed.

Another exemplary application of this in-situ stress monitoring mechanism is adjustment and optimization of the processing parameters and conditions in fabrication to reduce the stresses in the substrates. Because the CGS technique can be used to monitor the stresses in situ during the fabrication, contributions to the stresses from different processing steps can be identified by monitoring the stresses at each processing step. In addition, the processing parameters (e.g., temperature, duration or duty cycle) of each processing step may be adjusted either independently or in reference with the processing parameters of other processing steps to reduce the stresses. Effects on the stresses may be measured by the CGS technique upon each adjustment so that a relation between the parameter and the stresses can be established. The steps of adjusting a processing parameter and measuring the resultant stresses may be carried out in an iteration process until the resultant stresses are reduced to satisfactory levels. Hence, the processing steps can be controlled to increase the overall yield of the fabrication.

Yet another application of the CGS technique is to monitor large surface deformation which has an out-of-plane displacement greater than the thickness of the line and the substrate. Although the accuracy of the CGS measurements deteriorates if the surface deformation is no longer small compared to thickness of the line and the substrate, this deviation of the CGS measurements from predicted curvature values may be used as an indicator of presence of uniform, large surface deformations if the CGS system is used for in-situ monitoring.

Referring back to FIG. 1, after the curvature map is obtained, the processing module 106 then processes the curvature map to produce a corresponding stress map of the illuminated area on the sample surface. This is an important aspect of the system 100 shown in FIG. 1 and is accomplished by using a simple analytical formulation to compute the stresses on a feature from the curvature data and the material parameters of the substrate and the feature material.

In one implementation, the processing is based on a thermoelastic model for thin periodic line features formed on a thick substrate as described below. Certain aspects of the thermoelastic model, including detailed calculation steps, are disclosed by Wikstrom, Gudmundson, and Suresh, in "Thermoelastic Analysis of Periodic Thin Lines Deposited on A Substrate," Journal of the Mechanics and Physics of Solids, vol. 47, pp. 1113–1130 (May, 1999).

Figure 4A:
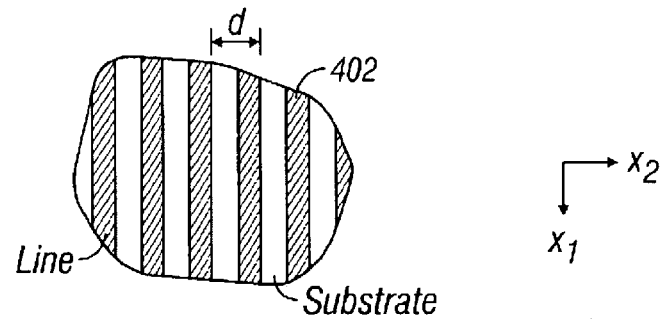
FIG. 4A illustrates a top view of an exemplary structure of a thermoelastic model according to one embodiment of the invention.
Figure 4B:
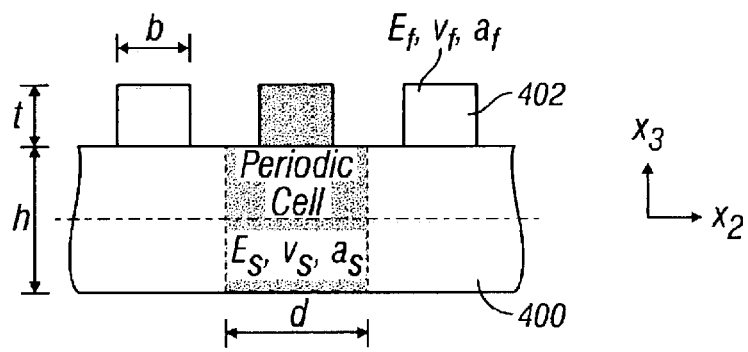
FIG. 4B illustrates a cross-sectional view of the structure shown in FIG. 4A.
Figure 7:
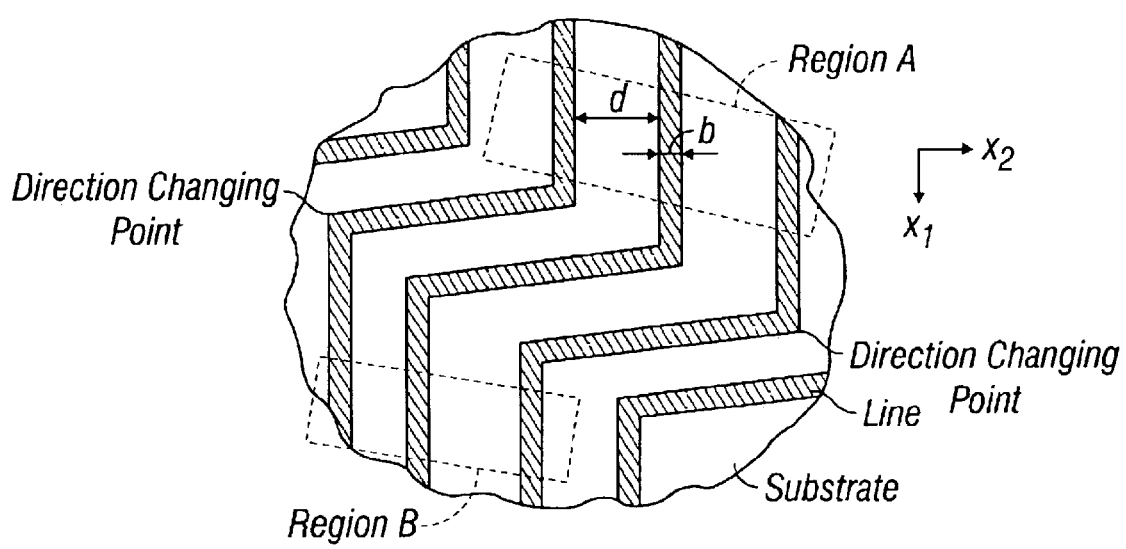
FIG. 7 illustrates two exemplary subdivision areas of patterned line features on a substrate.

FIGS. 4A and 4B schematically illustrate the structure of the thermoelastic model according to one embodiment. Multiple identical line features 402 are formed on a surface of a substrate 400. The line features 402 each have a width b and a thickness or height t and are evenly spaced from one another by a spacing d to form a periodic pattern. It is assumed that the dimension of the substrate 400 (e.g., diameter) is much greater than the thickness, h, of the substrate 400. For example, it may be sufficient for practical purposes that is at least 10 times, or preferably 50 times, greater than h in some devices. It is also assumed that both the thickness, t, and the width, b, of each line feature 402 are much less than, the longitudinal length l and the thickness h of the substrate 400, by at least a factor of 10, for example, 25 or greater. The accuracy of the model depends on these assumptions: the accuracy generally increases as these factors increase. Under these assumptions, the substrate 400 may be treated as a homogenized anisotropic plate.

A Cartesian coordinate system ($x_1$, $x_2$, $x_3$) is established in FIGS. 4A and 4B for the thermoelastic model. The directions marked $x_1$ and $x_2$ represent the directions along and across the line features, respectively, in the plane of the substrate 400. The direction marked $x_3$ represents the direction normal to the plane of the substrate 400. The volume average value of any quantity A over some volume V is defined as $$\bar{A} = \frac{1}{V} \int_v A(\chi_1, \chi_2, \chi_3) dV.$$

Based on the analysis by Wikstrom et al., supra., the volume-averaged stresses in each line feature 402 can be expressed in terms of the curvature $k_1$ along the $x_1$ direction (i.e., longitudinal), the curvature $k_2$ along the $x_2$ direction (i.e., transverse) of the substrate 400:

$$\begin{bmatrix} \overline{\sigma_{11}} \\ \overline{\sigma_{22}} \\ \overline{\sigma_{12}} \end{bmatrix} = \frac{-E_s}{6(1-v_s^2)} \frac{h^2}{t} \frac{d}{b} \begin{bmatrix} 1 & v_s & 0 \\ v_s & 1 & 0 \\ 0 & 0 & \frac{1-v_s}{2} \end{bmatrix} \begin{bmatrix} k_1 \\ k_2 \\ 0 \end{bmatrix}, \quad (1)$$

where $\sigma\alpha\beta$ represents the stress tensor components ($\alpha$, $\beta$=1, 2), and $E_s$ are $v_s$ are Young's modulus and Poisson's ratio of the substrate 400, respectively. The volume average of the shear stress $\sigma_{12}$ is zero in this case. The negative sign "−" in Equation (1) is used to implement an elected sign convention, i.e., a positive value represents one direction of the curvature while the negative value represents the opposite direction of curvature. Notably, each stress component is a linear sum given by $f_1(E_s, v_s, h, t, d, b).k_1 + f_2(E_s, v_s, h, t, d, b).k_2$, where coefficients $f_1$ and $f_2$ are functions of $E_s$, $v_s$, h, t, d, and b. Therefore, the stresses of each line feature can be computed based on elastic properties of the substrate and the geometry of the line features.

Hence, measurements of curvatures of the substrate 400 at each line feature 402 allow determination of volume-averaged elastic stresses by a simple analytical function based on dimension parameters of the substrate 400 and each line feature 402, the elastic properties of the substrate 400 (e.g., Young's modulus and Poisson's ratio). One of the features of this method is that the stress computation of Equation (1) does not require any detailed information on the material composition, the mechanical and other properties of the line feature itself. Although these characteristics of the line feature are among the primary factors that determine the stress behaviors of the line feature, the effects of these characteristics are included in the measured curvatures along and cross the line feature, $k_1$ and $k_2$.

Another feature of this method is that Equation (1) is a simple analytical formula and hence the stress computation based on the measured curvatures $k_1$ and $k_2$ can be carried out by a processor in a short time. For example, a microprocessor can be used to implement a computer routine to carry out the computation shown in Equation (1). Hence, complex and time-consuming numerical computations are essentially avoided. In addition, the simple analytical formula in Equation (1) has been shown to be accurate in comparison with complex numerical computations based on finite element analysis (Wikstrom et al., supra.). This feature of the data processing module, when combined with the full-field parallel processing of the CGS optical detection module, allows the stress measurement system 100 of FIG. 1 to measure the curvatures of a location and generate the respective stresses at a relatively high speed. Therefore, the system 100 may be used to measure temporal changes of curvatures and associated stresses of a line feature in real time for many processes of semiconductor fabrication.

The above stress computation method with respect to Equation (1) provides a way of obtaining stress data of a line feature on a substrate if the information on a thin film from which the line feature is formed is not available. An example of this situation is to determine the stresses in a device after the line feature is formed from a thin film such as a completed IC circuit.

FIG. 5 shows a flowchart of the above stress measurement method based on Equation (1). Such stress measurement can be performed either after the fabrication of the substrate is completed or during the fabrication as an in-situ monitoring mechanism.

An alternative method of the present application can be used to determine the stresses of line features patterned from a thin film on a substrate even before the line features are formed if the curvatures of the substrate and the thin film can be measured prior to patterning. One example of this situation is in-situ measurements during the fabrication by using the curvature measurement system 100 shown in FIG. 1.

First, before any layer is formed over the substrate, the curvature map of the bare substrate is measured (so is the associated stress map). When the substrate and the subsequent deposited continuous film thereon are essentially isotropic, the curvature at any location should be identical along any direction. Next, after a thin film is deposited on the substrate, the curvature map of the continuous film is measured. The stress in the unpatterned and continuous film at a location of interest can be determined from Stoney's equation:

$$\sigma_{film} = \frac{-E_s}{6(1-v_s)} \frac{h^2}{t} [k_{film} - k_s] \quad (2)$$

where $k_{film}$ and $k_s$ are the measured curvatures of the deposited film and the bare substrate at the same location of interest, respectively. Here, the sign convention is elected so that the curvature is positive when the substrate surface on which the film is deposited is convex and negative when the surface is concave.

If periodic line features are formed on this film, the curvatures across and along each line feature, $k_1$ and $k_2$, respectively, can be determined from elastic properties of the film and the substrate, and the geometry of the line features by the following analytical formula:

$$\begin{bmatrix} k_1 \\ k_2 \end{bmatrix} = k_{film} \frac{d}{b} \begin{bmatrix} 1 \\ 1 \end{bmatrix} - \frac{\chi}{1-\nu_s} \begin{bmatrix} \nu_{film} & -\nu_s \\ 1-\nu_s & \nu_{film} \end{bmatrix}, \quad (3)$$

where $\nu_{film}$ is the Poisson's ratio of the film, $\chi$ is given by $$\chi \approx (3.95138) \frac{t}{b} \sum_{j=1}^{10} \frac{d_j}{\left(1+\frac{t}{b}\right)^j},$$

and coefficient $d_j$ is given in TABLE 1. Note that when $$\frac{t}{b} \to o, \chi \to 0 \text{ and } \frac{t}{b} \to \infty, \chi \to 1.$$

See, Wikstrom et al., supra. Here, it is assumed that the changes in curvatures from $k_{film}$ to $k_1$ and $k_2$ are caused solely from changes in geometry from patterning the film into to line features. It also assumed that the elastic properties of the line features are essentially the same as the film.

TABLE 1

| Coefficients $d_j$ | |
|---|---|
| j | $d_j$ |
| 1 | 0.25256 |
| 2 | 0.27079 |
| 3 | -0.49814 |
| 4 | 8.62962 |
| 5 | -51.24655 |
| 6 | 180.96305 |
| 7 | -374.29813 |
| 8 | 449.59474 |
| 9 | -286.51016 |
| 10 | 73.84223 |

Accordingly, the volume-averaged elastic stresses on each line feature can be obtained from the following equation:

$$\begin{bmatrix} \overline{\sigma_{11}} \\ \overline{\sigma_{22}} \\ \overline{\sigma_{12}} \end{bmatrix} = \sigma_{film} \begin{bmatrix} 1-\chi\nu_{film} \\ 1-\chi \\ o \end{bmatrix}. \quad (4)$$

Figure 6:
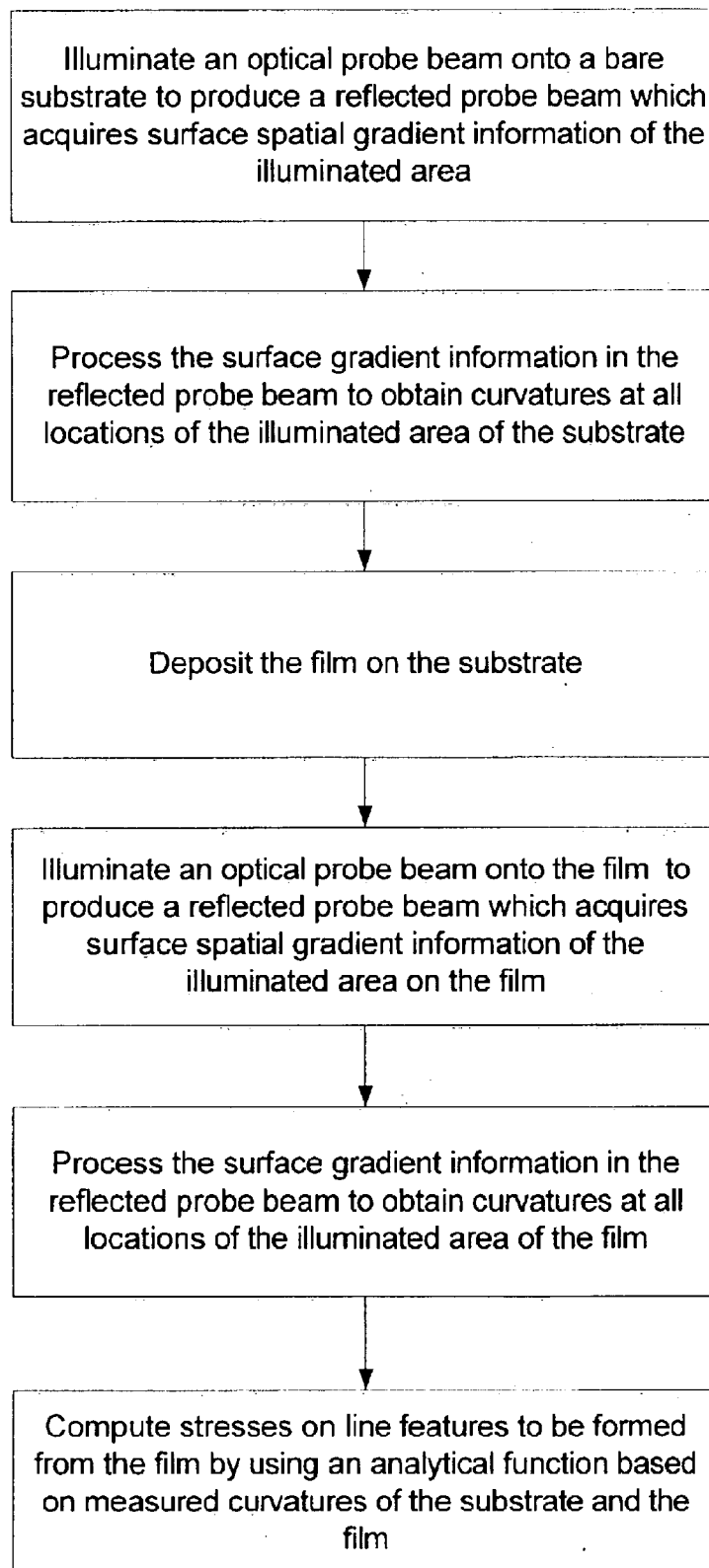

This method, like the previous, uses a simple analytical formulation of Equations (2), (3), and (4) to compute the stresses on each line feature. Unlike the previous method, however, the curvature of the substrate required in Equation (2) is measured before the film is deposited while the curvatures $k_1$ and $k_2$ of the substrate required in Equation (1) are measured after the line features are formed on the substrate. Hence, this method can be used to predict the stresses of line features to be formed. FIG. 6 shows a flowchart of the stress measurement based on Equation (4).

In addition, the analytical formulation of Equations (2), (3), and (4) can also be applied to lines formed over one or more thin films on the substrate. In this case, the parameter $k_s$ in Equation (2) is the total curvature of a structure formed by the underlying films and the substrate before the line-forming film is deposited. This total curvature can be directly measured by using the CGS method. To a first order approximation, the total curvature is the sum of curvatures that would be induced if each individual layer would be deposited by itself on the substrate.

The above stress measurement techniques can be applied to measure a substrate with line features that are oriented in more than one direction, for example, in mutually orthogonal directions. The entire area of interest on the substrate may be divided into two or more subdivision areas depending on the pattern formed thereon so that each subdivision area only has line features that are parallel to one another along one direction. Thus, the model for unidirectional line features as shown in FIGS. 4A and 4B is applicable to each individual subdivision area to compute the corresponding stresses based on the curvature data from the CGS measurement. A non-straight single conductive line hence may include two or more different segments in different subdivision areas. The stresses in this line are obtained by computing stresses in different segments based on the CGS curvature data.

Figure 9:
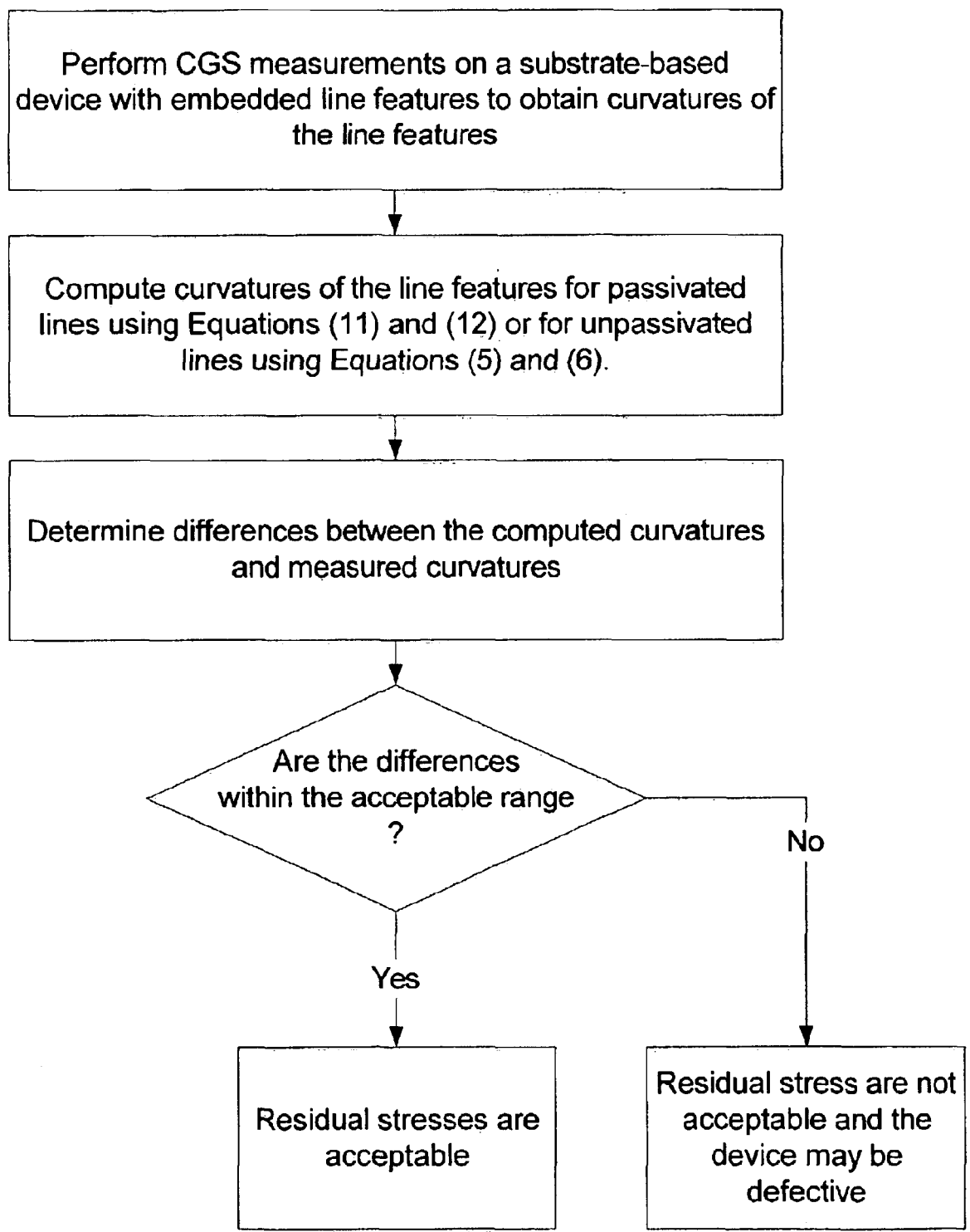
FIG. 9 shows a flowchart for using the system shown in FIG. 1 to measure curvatures of line features embedded in a layer on the substrate.

FIG. 9 shows a portion of line features formed on a substrate which includes two subdivision areas A and B. The directions of line features in each subdivision area are the same. The subdivision areas A and B may be selected in such a way that the distance from the edge in each area to the nearest sharp corner where the lines change direction is at least the greater value of one line width b or thickness t of each line feature. This condition can maintain the accuracy of the stress computation based on the model in FIGS. 4A and 4B. The subdivision areas A and B may be measured simultaneously in time by using the system 100 of FIG. 1 when the optical probe beam is directed to illuminate both areas A and B at the same time.

In many practical devices, line features formed over a substrate are often embedded in a different material. For example, conductive lines are often embedded in an insulating conductive material such as an oxide. The model shown in FIGS. 4A and 4B is no longer applicable to the analysis of curvatures and stresses of such structures. In fact, it is difficult to compute stresses in such embedded line features without complex numerical computation. However, a new model can be used to compute curvatures of an embedded line feature based on the structure design, material properties of the embedded line features and the surrounding material.

Figure 8A:
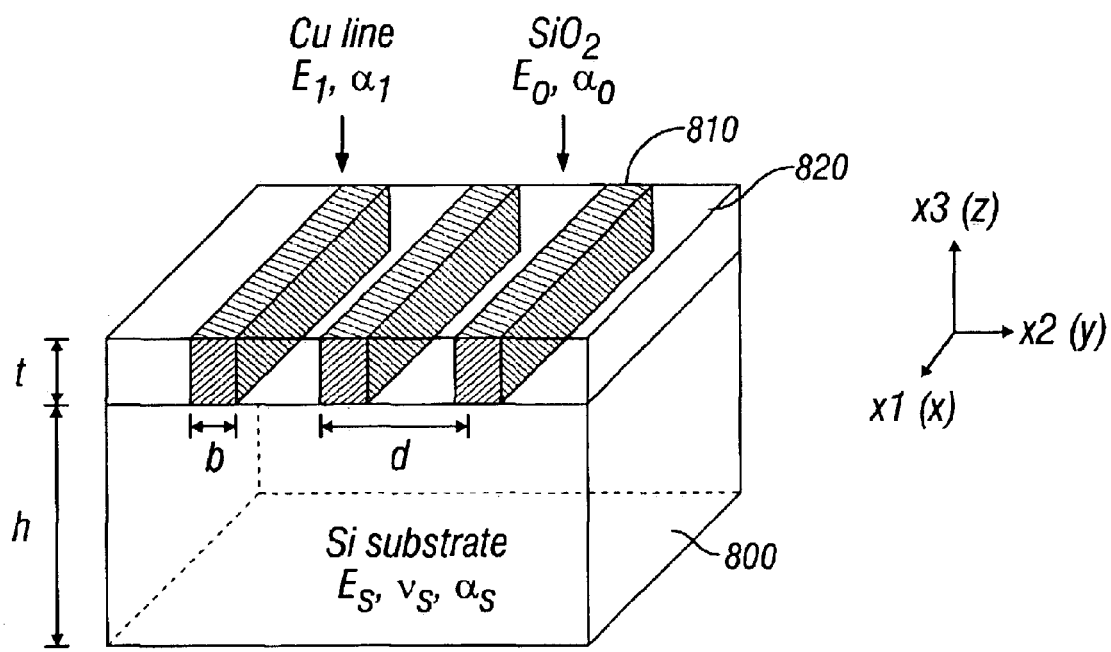
FIGS. 8A and 8B illustrate a model for line features embedded in a layer on a substrate and a model for line features embedded in a layer on a substrate and capped with a passivation layer.

FIG. 8A illustrates a model for computing curvatures of line features 810 embedded in trenches of a layer 820 formed on a substrate 800. Similar to the model in FIGS. 4A and 4B, the transverse dimension of the substrate 800 is assumed to be much greater than its thickness h. The line features 810 are parallel and are evenly spaced by a spacing d on the substrate 800 along the $x_2$ direction. The width b and the thickness t of each line feature 810 are also assumed to be much less than its longitudinal length along the $x_1$ direction and the thickness h of the substrate 800. See, Park and Suresh, "Effects of Line and Passivation Geometry on Curvature Evolution during Processing and Thermal Cycling in Copper Interconnect Lines," Acta Materialia (April, 2000).

It is further assumed that, the aspect ratio, $f_o=t/b$, of the line features 810 and the aspect ratio of the lines formed in surrounding layer 820, $f_1=t/(d-b)$, are comparable to or larger than unity, and that, the curvatures along and across the line features 810 do not influence one another for elastic deformation. According to Park and Suresh, supra., the curvature $k_1$ of the line features 810 along the line direction $x_1$ and the curvature $k_2$ perpendicular to the line direction $x_1$ caused by a change in temperature $\Delta T$ within the elastic range can be expressed as $$k_1 = \frac{6}{E_s}\frac{t}{h^2}E_1(\alpha_1 - \alpha_s)\Delta T, \quad (5)$$

$$k_2 = \frac{6}{E_s}\frac{t}{h^2}E_2(\alpha_2 - \alpha_s)\Delta T, \quad (6)$$

where $$E_1 = f_l E_l + f_o E_o = \frac{b}{d}E_l + \left(1 - \frac{b}{d}\right), \quad (7)$$

$$E_2 = \frac{E_l E_o}{f_l E_0 + f_o E_l}, \quad (8)$$

$$\alpha_1 = \frac{f_l E_l \alpha_l + f_o E_o \alpha_0}{f_l E_l + f_o E_o}, \quad (9)$$

$$\alpha_2 = f_l \alpha_l + f_o \alpha_o + \frac{f_l f_o (\nu_l E_o - \nu_o E_l)(\alpha_l - \alpha_0)}{f_l E_l + f_o E_o} \quad (10)$$

and $E_1$, $\nu_1$, and $\alpha_1$ are Young's moduli, Poisson's ratio, and coefficient of thermal expansion for the line features 810, respectively, and $E_o$, $\nu_o$, $\alpha_o$ are Young's moduli, Poisson's ratio, and coefficient of thermal expansion for the layer 820, respectively. In the composite analogy, the layer comprising the line features 810 (e.g., Cu lines) and the surrounding layer 820 (an oxide such as silicon dioxide) is homogenized as an anisotropic composite layer with Young's moduli $E_1$ and $E_2$ along and across the line direction, respectively, and with thermal expansion coefficients, $\alpha_1$ and $\alpha_2$ along and across the line direction, respectively.

The predictions of this simple analytical analysis have been shown to be reasonably close to the results of more detailed finite element simulations, with a deviation from about 3% to about 17%. For some practical configurations of Cu lines in oxide trenches, the error is typically smaller than 17%.

Figure 8B:
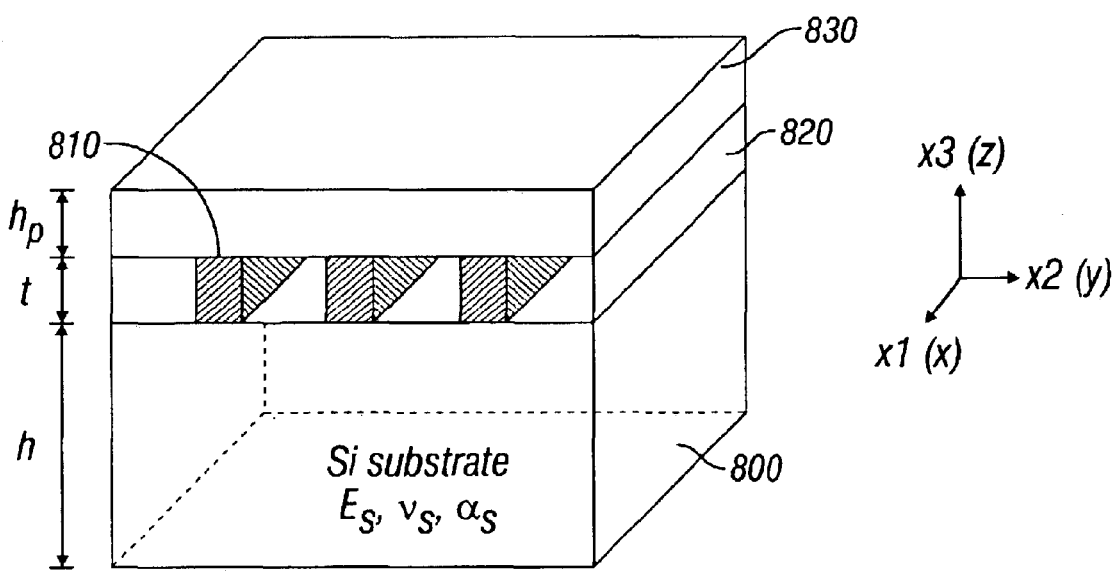

FIG. 8B shows another model where a capping passivation layer 830 is formed over the line features 810 and the layer 820. Assuming the passivation layer 830 is much thinner than the substrate 800, the curvatures of the passivated line features 810, due to elastic deformation caused by a change $\Delta T$ in temperature, can be expressed as $$k_1^{pass} = \frac{6}{E_s}\frac{t}{h^2}E_1(\alpha_1 - \alpha_s)\Delta T + 6\frac{h_p}{h^2}\cdot\frac{E_p}{E_s}\cdot\frac{(1-\nu_s)}{(1-\nu_p)}(\alpha_p - \alpha_s)\Delta T, \quad (11)$$

$$k_2^{pass} = \frac{6}{E_s}\frac{t}{h^2}E_2(\alpha_2 - \alpha_s)\Delta T + 6\frac{h_p}{h^2}\cdot\frac{E_p}{E_s}\cdot\frac{(1-\nu_s)}{(1-\nu_p)}(\alpha_p - \alpha_s)\Delta T, \quad (12)$$

where $E_p$, $\nu_p$, $\alpha_p$ are Young's modulus, Poisson's ratio, and coefficient of thermal expansion for the passivation layer 830, respectively.

The above models shown in FIGS. 8A and 8B can be used to compute the curvatures of embedded lines on the substrate based on the certain known parameters of the substrate-based devices. Although the stresses of the embedded lines cannot be directly computed from Equations (5)–(12), the models can be implemented in the processing module 105 of the system 100 shown in FIG. 1 to determine whether residual stresses exist in the devices.

FIG. 9 shows a flowchart of combining the CGS measurements with the curvature estimation based on the models in FIGS. 8A and 8B to determine the stress information of the embedded lines. First, the curvatures of embedded lines of a device are measured by the CGS method and computed based on the models in FIGS. 8A and 8B. The CGS measurements provide actual curvatures of the lines while the computed curvatures are only the curvatures caused by elastic deformation. Next, the computed curvatures and the measured curvatures are compared. Their differences indicate the curvatures caused by residual stresses which are not included in the computation. The residual stress should be kept below an acceptable level in order to ensure the normal operation and a desired lifetime of the device. Hence, when the difference either along or cross the line exceeds the acceptable level, the liability or performance of device may be considered as being unacceptable.

The above process can be used to monitor the stresses in the embedded lines during the fabrication process because the CGS is capable of in-situ measurements. The differences in curvatures between the analysis and CGS measurements provide an indication what actually is going on with respect to stress/curvature evolution that is not accounted for in design. Hence, one or more aspects of the fabrication or the design of the devices may be examined and modified to reduce the residual stresses within the acceptable range. In addition, the in-situ measurements may also be used to terminate the fabrication prior to the completion of the entire process if the residual stresses exceed above the acceptable level at an intermediate step. This monitoring mechanism may reduce the cost and increases fabrication efficiency.

Equations (5), (6) and (11), (12) may also be used to fit measured curvature data to determine a property of the line features or the substrate, such as the Young's modulus, the coefficient of the thermal expansion, and Poisson ratio of the substrate or the line feature. For example, in devices with the passivation layer 830, the CGS measurements of the curvatures may be used to determine properties of the passivation layer 830 based on Equations (11) and (12). The biaxial modulus of the passivation layer 830, $E_{p,B}=E_p/(1-\nu_p)$ can be computed from the CGS measurements of $k_1^{pass}$ and $k_2^{pass}$ that are made during the process before and after the passivation layer is deposited.

The above method for measuring embedded lines can be applied to a new fabrication technique for making copper conductive lines in oxide trenches, "Damascene process." With this technique, trenches are etched in an oxide layer to conform to the geometry of the copper interconnect lines in the circuit formed on a Si substrate. The etching is performed by using a dry etching process. These oxide trenches are then plugged with Cu with the use of chemical vapor deposition (CVD) or electroplating. The extra copper above the trenches is then removed by chemical-mechanical polishing (CMP), and then a passivation or a capping layer is deposited on top of the interconnect structure.

Since the Damascene process involves material removal by polishing, the knowledge of curvature evolution during polishing and subsequent processing is essential on various counts. For example, in-situ monitoring of curvatures using the CGS method can provide information on the "flatness" of the polished surface upon which layers are deposited. This can be an essential step in quality control. Also, a knowledge of curvature evolution can also give an indication of the evolution of internal stresses during fabrication.

Furthermore, the above analysis for unpassivated and passivated lines can also be used to simulate the evolution of elastic stresses during thermal cycling, and can be readily compared with CGS measurements. Examples of such calculations are given in Park and Suresh, and are verified by comparisons with finite element simulations.

In addition to measuring the stresses caused by elastic changes, the system 100 shown in FIG. 1 may also be configured, based on the model in FIGS. 4A and 4B, to determine some plastic properties of line features formed on a substrate. Line features formed on a substrate may be subject to permanent and plastic deformation under certain thermomechanical treatments. In general, a line feature and the thin film experience elastic deformation when the temperatures are below threshold yield temperatures $T_l^Y$ and $T_f^Y$, respectively. The curvatures of elastic deformation change linearly with the temperatures. When the temperatures are above the threshold yield temperatures $T_l^Y$ and $T_f^Y$, however, plastic deformation occurs and the curvatures change with the temperatures in a nonlinear manner. For example, plastic deformation may occur in, conductive lines when heated above the yield temperature during passivation. It is desirable to determine the stresses caused by such plastic deformation.

Suppose that the initial stress-free temperature of a line feature and the continuous film from which the line feature is patterned on the substrate are $T_l^0$ and $T_f^0$, respectively. The stress-free temperature ranges of the line/substrate and film/substrate systems can be determined experimentally using the CGS technique to measure the curvatures as a function of temperature. The curvature of the unprocessed continuous film may be determined based on Equation (2) as described above. The temperature change, from the initial stress-free temperature, to initiate plastic yielding in the line and the film, respectively, can be written as:

$$\Delta T_l^Y = T_l^1 - T_l^0 = \frac{1-v_f}{E_f(\alpha_s - \alpha_f)} \frac{\sigma_l^Y}{Z^e}, \quad (13)$$

$$\Delta T_f^Y = T_f^1 - T_f^0 = \frac{1-v_f}{E_f(\alpha_s - \alpha_f)} \sigma_f^Y. \quad (14)$$

where $Z^e$ is given by $$Z^e = \{(1-\chi v_f)^2 - [\chi(1-\chi)(1-v_f)]\}^{1/2}. \quad (15)$$

where $T_l^Y$ and $T_f^Y$ are temperatures at which permanent, plastic deformation begins to occur in the line feature and the continuous film. At temperatures above $T_l^Y$ and $T_f^Y$, the curvatures of the line and the film begin to change nonlinearly with temperature. Equations (13)–(15) can be derived based on the model in FIGS. 4A and 4B based on an analysis by Gouldstone, Wikstrom, Gudmundson and Suresh in "Onset of Plastic Yielding in Thin Metal Lines Deposited on Substrates", Scripta Materialia, vol. 41, No. 3, pp. 297–304, (August 1999).

From Equations (13) and (14), the following can be obtained $$\frac{\Delta T_l^Y}{\Delta T_f^Y} = \frac{\sigma_l^Y}{\sigma_f^Y} \frac{1}{Z^e}. \quad (16)$$

Because the ratio of the temperature difference can be measured by using the CGS technique and the parameter $Z^e$ can be calculated based on Equation (4), the ratio of the yield stresses of the line feature and the film can be determined from Equation (16). Thus the CGS method, in conjunction with the above analysis, provides a useful tool for determining the onset of yielding in patterned lines.

The above methods and systems may be used to measure, in real time, the history and spatial variation of stresses on the substrate, line features or films formed thereon. In particular, measurements from the coherent gradient sensing method can be rapidly processed by analytical computations to obtain spatial and temporal variations of stresses and plastic strains. Information on plastic deformation of the line features and films on the substrate can also be measured.

A number of embodiments of the invention have been described. Nevertheless, it will be understood that various modifications and enhancements may be made without departing from the following claims.

What is claimed is:

1. A system, comprising:

a detection module having a radiation source to produce a probe beam, a beam-guiding element to direct said probe beam to a reflective surface of a substrate with line features to produce a reflected probe beam, a radiation-processing module to manipulate said reflected probe beam to produce a radiation output, and a radiation detection unit to convert said radiation output to produce a curvature signal having curvature information of an area of the reflective surface based on said reflected probe beam; and a processing module coupled to receive and process said curvature signal and operable to compute stresses of each line feature on said substrate from an analytical function of curvatures in two different directions of the substrate corresponding to the location of the line feature.

2. The System as in claim 1, wherein said processing module is operable to:

extract information of a surface spatial gradient of an illuminated area on the substrate;

process the surface spatial gradient information to simultaneously measure a first curvature of the substrate along a longitudinal direction of the line feature and a second curvature of the substrate at the same location along a transverse direction perpendicular to the longitudinal direction; and compute the stresses on the line feature based on measured first and second curvatures.

3. The system as in claim 1, wherein Bald processing module is operable to:

compare the computed stresses on the line feature to an acceptable maximum stress; and generate an indicator when a computed stress on the line feature exceeds the acceptable maximum stress.

4. The system as in claim 1, wherein said radiation source includes a laser.

5. The system as in claim 1, wherein said radiation-processing module includes two optical gratings.

6. A system comprising:

a first mechanism to extract information of a surface spatial gradient of an illuminated area on a substrate from an radiation image pattern obtained from a reflection of radiation from the illuminated area;

a second mechanism to process the surface spatial gradient information to simultaneously measure a first curvature of the substrate along a longitudinal direction of at least one line feature and a second curvature of the substrate at the same location along a transverse direction perpendicular to the longitudinal direction; and a third mechanism to compute the stresses on the line feature based on measured first and second curvatures according to an analytical function.

7. The system as in claim 6, wherein the first mechanism is operable to perform a spatial differentiation on an interference pattern produced from the reflection to extract the information of the surface spatial gradient within the illuminated area.

8. The system as in claim 7, wherein the first mechanism comprises two optical diffraction gratings in series along an optical path to perform the spatial differentiation.

9. The system as in claim 1, wherein said radiation-processing module is configured to optically perform a spatial shearing on the reflected probe beam so that the radiation output carries surface spatial gradient information within an area on the reflective surface illuminated by the probe beam.

* * * * *